United States Patent [19]

Ovshinsky et al.

[11] Patent Number: 4,696,758
[45] Date of Patent: * Sep. 29, 1987

[54] GAS MIXTURES FOR THE VAPOR DEPOSITION OF SEMICONDUCTOR MATERIAL

[75] Inventors: Stanford R. Ovshinsky, Bloomfield Hills; Subhendu Guha, Clawson; Prem Nath, Rochester; Chi Chung Yang, Troy; Jeffrey Fournier, St. Clair Shores; James Kulman, Detroit, all of Mich.

[73] Assignee: Energy Conversion Devices, Inc., Troy, Mich.

[*] Notice: The portion of the term of this patent subsequent to Jan. 20, 2004 has been disclaimed.

[21] Appl. No.: 897,236

[22] Filed: Oct. 6, 1986

Related U.S. Application Data

[63] Continuation of Ser. No. 718,661, Apr. 1, 1985, Pat. No. 4,637,895.

[51] Int. Cl.$^4$ .............................................. C09K 11/07
[52] U.S. Cl. .................................. 252/188.31; 427/39; 136/261; 136/258; 252/372
[58] Field of Search ........................... 252/188.31, 372; 427/39; 136/261, 258

[56] References Cited

U.S. PATENT DOCUMENTS

| | | | |
|---|---|---|---|
| 4,363,868 | 12/1982 | Takasaki et al. | 427/39 X |
| 4,388,344 | 6/1983 | Shuskus et al. | 427/39 X |
| 4,405,656 | 9/1983 | Shimizu et al. | 427/39 |
| 4,517,223 | 5/1985 | Ovshinsky et al. | 427/39 |

Primary Examiner—John F. Terapane
Assistant Examiner—Susan Wolffe
Attorney, Agent, or Firm—Marvin S. Siskind; Richard M. Goldman

[57] ABSTRACT

Precursor gaseous mixtures from which to glow discharge deposit wide and narrow band gap semiconductor alloy material, said material characterized by improved photoconductivity and stability and improved resistance to photodegradation. There is also specifically disclosed a method of fabricating a narrow band gap semiconductor which method does not suffer from the effects of differential depletion of the components of the precursor gaseous mixture.

9 Claims, 2 Drawing Figures

FIG. 2

| | $H_2$ $GeH_4$ $SiH_4$ $(B_2H_6)$ | $H_2$ $GeH_4$ $Si_2H_6$ | $H_2$ $SiF_4$ $GeH_4$ $SiH_4$ $(B_2H_6)$ | $H_2$ $SiF_4$ $GeH_4$ $Si_2H_6$ |
|---|---|---|---|---|
| $\sigma_{ph}$ (ohm cm)$^{-1}$ | $3-6 \times 10^{-6}$ ($1-2 \times 10^{-5}$) | $3-6 \times 10^{-6}$ | $3-6 \times 10^{-6}$ ($1-2 \times 10^{-5}$) | $2-3 \times 10^{-5}$ |
| $\sigma_D$ (ohm cm)$^{-1}$ | $1-3 \times 10^{-9}$ ($2-3 \times 10^{-8}$) | $1-2 \times 10^{-9}$ | $1-3 \times 10^{-9}$ ($2-3 \times 10^{-8}$) | $1-2 \times 10^{-8}$ |
| $E_g$ (eV) | 1.5 | 1.5 | 1.5 | 1.5 |
| $E_a$ (eV) | .74 (.65) | .69 | .74 (.65) | .64 |
| RELATIVE SUB BAND GAP ABSORPTION AT 1.1 eV | 10-20 (10-20) | 10-20 | 10-20 (10-20) | 2-4 |
| DEPOSITION RATE Å/sec | 1-2 | 3-5 | 1-2 | 3-5 |
| PHOTODEGRADATION AFTER 16 HOURS EXPOSURE TO AM-1 | (-34%) | — | (-12%) | -5% |

GAS MIXTURES FOR THE VAPOR DEPOSITION OF SEMICONDUCTOR MATERIAL

This is a continuation of application Ser. No. 718,661 filed Apr. 1, 1985.

FIELD OF THE INVENTION

This invention relates generally to semiconductor alloys, and more particularly to vapor deposited thin film semiconductor alloy materials. Particular gas mixtures which may be advantageously employed for the vapor deposition of high quality, thin film semiconductor alloy materials as well as techniques for the vapor deposition of semiconductor alloy materials utilizing those gas mixtures are disclosed.

BACKGROUND OF THE INVENTION

Owing to the increasing scarcity of non-renewable energy reserves such as coal, petroleum and uranium, increased use is being made of alternative nondepletable energy sources, such as photovolatic energy. Single crystal photovoltaic devices, especially crystalline silicon photovoltaic devices, have been utilized for some time as sources of electrical power because they are inherently non-polluting, silent and consume no expendable natural resources in their operation. However, the utility of such devices has been limited by problems associated with the manufacture thereof. More particularly, single crystal semiconductor alloy materials (1) are difficult to produce in sizes substantially larger than several inches in diameter; (2) are thicker and heavier than their thin film counterparts; and (3) are expensive and time consuming to fabricate.

Recently, considerable effort has been expended to develop systems and processes for preparing thin film amorphous semiconductor alloy materials which encompass relatively large areas and which can be deposited so as to form p-type and n-type semiconductor alloy layers for the production therefrom of thin film electronic devices, particularly thin film p-n type and n-i-p type photovoltaic devices which are substantially operatively equivalent or superior to their crystalline counterparts. It should be noted at this point that the term "amorphous" as used herein, is defined to include alloys or materials exhibiting long range disorder, although said alloys or materials may exhibit short or intermediate range order or even contain crystalline inclusions.

Amorphous thin film semiconductor alloys have gained acceptance as the material from which to fabricate electronic devices such as photovoltaic cells, photoresponsive and photoconductive devices, transistors, diodes, integrated circuits, memory arrays and the like. This is because the amorphous thin film semiconductor alloys (1) can be manufactured by relatively low cost continuous processes, (2) possess a wide range of controllable electrical, optical and structural properties and (3) can be deposited to cover relatively large areas. Among the semiconductor alloy materials exhibiting the greatest present commercial significance are amorphous silicon, germanium and silicon-germanium based alloys. Such alloys have been the subject of a continuing development effort on the part of the assignee of the instant invention, said alloys being investigated and utilized as possible candidates from which to fabricate a wide range of semiconductor, electronic and photoresponsive devices.

Additionally, said assignee has developed commercial processes for the continuous roll-to-roll manufacture of large area photovoltaic devices. Such continuous processing systems are disclosed in the following U.S. Patents, disclosures of which are incorporated herein by reference: U.S. Pat. No. 4,400,409, for A Method Of Making P-Doped Silicon Films And Devices Made Therefrom; U.S. Pat. No. 4,410,588, for Continuous Amorphous Solar Cell Production Systems; and U.S. Pat. No. 4,438,723, for Multiple Chamber Deposition and Isolation System And Method. As disclosed in these patents a web of substrate material may be continuously advanced through a succession of interconnected, environmentally protected deposition chambers, wherein each chamber is dedicated to the deposition of a specific semiconductor alloy material onto the web or onto a previously deposited layer. In making a photovoltaic device, for instance, of n-i-p type configurations, the first chamber is dedicated for the deposition of an n-type semiconductor alloy material, the second chamber is dedicated for the deposition of a substantially intrinsic amorphous semiconductor alloy material, and the third chamber is dedicated for a deposition of a p-type semiconductor alloy material. The layers of semiconductor alloy material thus deposited in the vacuum envelope of the deposition apparatus may be utilized to form photoreponsive devices, such as, but not limited to, photovoltaic devices which include one or more n-i-p type cells. By making multiple passes through the succession of deposition chambers, or by providing an additional array of deposition chambers, multiple stacked cells of various configurations may be obtained. Note, that as used herein the term "n-i-p type" will refer to any sequence of n and p or n, i and p semiconductor alloy layers operatively disposed and successively deposited to form a photoactive region wherein charge carriers are produced by the absorption of photons from incident radiation.

The concept of utilizing multiple stacked cells, to enhance photovoltaic device efficiency, was described at least as early as 1955 by E.D. Jackson in U.S. Pat. No. 2,949,498 issued Aug. 16, 1960. The multiple cell structures therein discussed were limited to the utilization of p-n junctions formed by single crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell, a large band gap material absorbs only the short wavelength light, while in subsequent cells, smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. Such tandem cell structures can be economically fabricated in large areas by employing thin film amorphous, semiconductor alloy materials (with or without crystalline inclusions), in accordance with the principles of the instant invention. It should be noted that Jackson employed crystalline semiconductor materials for the fabrication of his stacked cell structure; however, since it is virtually impossible to match lattice constants of differing crystalline materials, it is not possible to fabricate such crystalline tandem cell structures in a commercially feasible manner. In contrast thereto, and as the assignee of the instant invention has shown, such tandem cell structures are not only possible, but can be economically fabricated over large areas by employing the amorphous semiconductor alloy materials and deposition techniques described herein.

As described in the previously referenced patents and applications, Applicants' assignee is now able to manufacture large area stacked, photovoltaic devices on a commercial basis utilizing a roll-to-roll processor. In particular, said assignee has developed a high volume combination r.f. and microwave energized apparatus for the fabrication of photovoltaic devices, said apparatus described in U.S. patent application Ser. No. 711,785 entitled Hybrid Semiconductor Processor And Gas Mixtures For Use In That And Other Processors, filed Mar. 14, 1985, now abandoned the disclosure of which is incorporated herein by reference. As disclosed in said application, microwave and/or radio frequency energy may be utilized to continuously deposit successive layers of semiconductor alloy material over very large area substrates.

Gas depletion is a significant problem encountered in the glow discharge plasma deposition of thick (over approximately 1000 angstroms) layers of semiconductor alloy material upon large area substrates. Gas depletion occurs under the influence of an electromagnetic field when certain gaseous components of the precursor process gas mixture decompose and deposit at greater rates than do other gaseous components of the precursor process gas mixture. Spatial irregularities or inhomogeneties in the composition of the deposition plasma and the resultant inhomogeneities and nonuniformities present in the deposited semiconductor alloy material can arise as a result of this type of gas depletion. These inhomogeneities and nonuniformities result in the deposition of layers of semiconductor alloy material having non-uniform electrical, chemical and optical properties. The problem of gas depletion is particularly manifested when a relatively thick (over 3000 angstrom) layer of narrow band gap silicon: germanium alloy material is being deposited from silane and germane precursor gases in a roll-to-roll processor. This is because the germane gas "cracks" much more easily than does the silane gas and the germanium is deposited therefrom at a much faster rate than is the silicon. Since it is necessary to deposit such a thick layer, the cathode must be very long (approximately seven feet) and the gaseous components which make up the precursor mixture must be kept uniform throughout that length. It is also to be noted that the problem of gas depletion is particularly significant in a microwave energized plasma deposition system insofar as the high energy of the microwave power results in high deposition rates in which the precursor components are even more readily cracked. Therefore, the use of microwave energy can be seen to exacerbate gas depletion problems with precursor components which do not crack at equal rates.

By way of a more specific illustration, a silicon: germanium alloy comprising approximately 60 percent silicon and 40 percent germanium has a band gap of approximately 1.4 eV and has significant utilization as the bottom layer of intrinsic semiconductor alloy material in a triple tandem photovoltaic device. Applicants have found that the use of a precursor gaseous mixture, which includes the typical process gases (i.e. silane and germane), presents significant problems in the preparation of such a 1.4 eV band gap silicon: germanium alloy. First of all, the difficulty in achieving the appropriate mixture of discrete precursor gases must be appreciated. In order to deposit a semiconductor alloy composition having approximately 60 percent silicon and 40 percent germanium, a gas mixture of silane and germane having far less than 40 percent germane must be employed since (as previously stated) the germanium from the germane gas deposits at a higher rate than does the silicon from the silane gas. Furthermore, the particular composition of this gas mixture is also dependent upon, inter alia, the deposition power and the geometry of the deposition system. A trial and error approach must therefore be employed to achieve the proper gas mixture for the deposition of a preselected semiconductor alloy composition which can be uniformly maintained for a prolonged period of deposition. In addition to the problems in formulating the initial mixtures of process gases, the rapid depletion of the germanium-containing precursor gas leads to spatial inhomogeneities and nonuniformities in the deposited film of semiconductor alloy material.

Various approaches to solving the problem of depletion of the germanium-containing gas relative to the silicon-containing gas have been implemented with varying degrees of success. For example, U.S. patent application Ser. No. 664,453 filed Oct. 24, 1984, entitled Cathode Assembly With Localized Profiling Capabilities, which application is assigned to the assignee of the instant invention and the disclosure of which is incorporated herein by reference, discloses an electrode for a glow discharge deposition system. The electrode is specifically designed with the capability of introducing any combination of precursor process gases at differing locations along the length thereof to substantially reduce the effects of the gas depletion. More particularly, the electrode functions to refresh and supplement discrete components of the process gas mixture at preselected longitudinal locations in the plasma region and thereby substantially obviates the effects of gas depletion. While satisfactory results are obtained with this system, (1) it is a "hardware solution", requiring modification of presently utilized deposition systems, and (2) it is not readily adaptable for microwave energized deposition systems insofar as the gas introduction is accomplished through the energized cathode plate itself, and most microwave deposition systems do not include an energized cathode, but rely upon the use of antennae or waveguides for the introduction of the microwave energy. Accordingly, it is desirable that the problem of gas depletion be addressed and solved for both microwave and radio frequency energized systems without the necessity of including extraneous hardware such as the cathode assembly of the aforementioned application.

In accordance with one aspect of the instant invention, it has been discovered that disilane, as well as other higher order silanes such as $Si_3H_8$, $Si_4H_{10}$, etc. and "substituted" higher order silanes such as fluorinated higher order silanes, collectively refered to herein as polysilanes, may be advantageously employed to eliminate problems of gas depletion. It has been found that polysilanes, under the influence of the electromagnetic field developed in a glow discharge deposition system, decompose and deposit the silicon therefrom at a higher rate than does silane or silicon tetrafluoride. Applicants have formulated a multi-component process gas mixture which includes a germanium-containing gas such as germane and a polysilane gas such as disilane. Under the influence of a glow discharge deposition plasma the germanium-containing gas and the silicon-containing gas decompose at a approximately similar rates to deposit a silicon: germanium alloy. Since the two gases decompose at approximately the same rate, the composition of the gas mixture will be essentially unchanged throughout the deposition process. Therefore, problems resulting from the differential depletion of the two components of the precursor gaseous mixture will be eliminated and the deposited alloy will be homogeneous and uniform in composition and exhibited properties. Additionally, since the component gases of the mixture decompose at approximately similar rates, the composition of the initial gas mixture will be reflected in the homogeneous and uniform stoichiometry of the alloy deposited across the surface of a large area substrate. It should thus be apparent that the use of the gas mixtures of the instant invention, which will be described in greater detail hereinbelow, confers signigicant advantages in the preparation of multi-component semiconductor alloys insofar as such mixtures eliminate the problems of gas depletion.

While it has been found that polysilanes, particularly disilane, may be utilized in conjunction with germanium-containing gases to eliminate problems of differential gas depletion, Applicants have also found that such polysilanes may be advantageously employed either with or without a germanium-containing precursor gas to produce a semiconductor alloy exhibiting high quality electronic properties. The improvements are manifested in (1) improved photovoltaic properties of the bulk material, such as high photoconductivity, a low density of states in the band gap and so forth, and (2) improved performance in photovoltaic devices in which the semiconductor alloys are incorporated, i.e., increased efficiency and decreased degradation.

Although the exact reason for the superior properties manifested by polysilane deposited materials is not completely understood, Applicants believe the reason is that polysilanes produce a greater number of desirable deposition species (species found in the plasma which provide high quality photovoltaic properties when deposited as semiconductor alloy material). It is known by those skilled in the art of plasma deposition that conditions which exist and the composition of species present within the plasma region are highly complex and uncontrollable. Some researchers in the field have described the plasma as being a "zoo" populated by numerous and rapidly changing exotic activated species of the precursor gaseous mixture introduced thereinto; the species formed by the fragmentation, ionization, radicalization and recombination of that gaseous mixture. It is known that the composition and characteristics of the deposited semiconductor alloy material will depend, inter alia, upon the particular excited species producing that deposit. For instance, certain species favor the deposition of tetrahedrally coordinated semiconductor alloy material, while other species favor the deposition of highly defective material, i.e., material having a significant number of defects, dangling bonds, strained bonds and/or vacancies therein. It is Applicants' belief that the polysilane gases of the instant invention produce a greater percentage of the desirable deposition species when exposed to plasma conditions, which species tend to deposit semiconductor alloy material having high quality photoelectrical properties. It is now a scientifically accepted principle that these high quality photoelectric properties are due, at least in part, to the presence of tetrahedral coordination in depositing material.

As disclosed in U.S. Pat. No. 4,226,898 of Ovshinsky, et al entitled Amorphous Semiconductors Equivalent To Crystalline Semiconductors Produced By A Glow Discharge Process, which patent is assigned to the assignee of the instant invention and the disclosure which is incorporated herein by reference, fluorine introduced into layers of amorphous silicon alloy semiconductor material operates to substantially reduce the density of localized defect states in the energy gap thereof and facilitates the addition of other alloying materials, such as germanium. As a result of the introduction of fluorine into the host matrix of the amorphous semiconductor alloy, the films so produced exhibit a number of favorable attributes similar to those of crystalline semiconductor materials. A fluorinated amorphous semiconductor alloy can thereby provide relatively high photoconductivity, increased charge carrier mobility, increased diffusion length of charge carriers, low dark intrinsic electric conductivity, and where desired, such alloys can be modified to help shift the Fermi level to provide substantially n or p type extrinsic electrical conductivity. As disclosed therein fluorinated amorphous semiconductor alloy materials can act like crystalline materials and be useful in the manufacture of photoresponsive devices such as, solar cells and current controlling devices including diodes, transistors and the like.

Fluorine is a "super-halogen", exhibiting the highest electronegativity of all of the elements, and is quantitatively and qualitatively different from the other halogens. As previously recognized and reported, fluorine acts in several ways to produce a better alloy material. For instance, fluorine can act in the bulk of a semiconductor alloy material to organize the local order of atoms to assure the formation of proper electronic configurations. Additionally, fluorine can passivate dangling bonds, reduce deviant bonding configurations and generally lower the density of states of a semiconductor alloy material into which it is incorporated.

Applicants have found that fluorine, in addition to its effect on the bulk of a semiconductor alloy material, can also act at the depositing surface of the semiconductor alloy material to improve the electronic properties of that material. The addition of a small amount of fluorine into the deposition atmosphere, or alternatively, the post deposition treatment of a semiconductor alloy material with fluorine can serve to reduce the number of surface states in that material. In this manner, a relatively small amount of fluorine can significantly improve the electronic, chemical and optical properties of a depositing layer of semiconductor alloy material.

It has now been recognized by Applicants that even small amounts of fluorine gas significantly affect the composition of the glow discharge plasma (separate from any influence the fluorine exerts in or on the depositing film), which plasma effects result in a significant improvement in the photoelectronic properties of the deposited semiconductor alloy material. More particularly, it has been found that the addition of even relatively small amounts of fluorine to the energetic plasma environment results in the deposition of semiconductor alloy material having significantly increased photoconductivity and a lower density of states in the band gap. Such semiconductor alloy material can be utilized to produce photovoltaic devices having high efficiency and long term stability.

The manner in which fluorine acts within the electromagnetic field established by a glow discharge is as complex as the plasma itself. As discussed previously, the plasma includes a multitude of highly excited species, some of which result in the deposition of high quality semiconductor alloy material whereas others of which result in the deposition of low grade semiconductor alloy material. It is now believed by Applicants that fluorine acts to organize the species in the plasma so as to produce a greater number of the optimum deposition species than are ordinarily present. Thus, fluorine may be said to act as a "plasma catalyst" facilitating, through its high electronegativity and high reactivity, the formation and maintenance of desirable free radical and/or ionic species in the plasma, which desirable species are then deposited as high quality semiconductor alloy material.

It is also hypothesized that fluorine acts in a catalytic manner upon the depositing surface of the layer of semiconductor alloy material to improve the photoresponsive properties of that layer by (1) insuring proper tetrahedral incorporation of the depositing atoms, (2) removing depositing species having undesirable or weak bonding configurations or (3) catalyzing the reformation of improper bonds. For example, fluorine may "etch away" certain species from the surface of the depositing material and recycle those species back into the plasma for re-excitation into the desirable tetrahedral configuration. Fluorine may thus be seen to act as a catalyst upon the surface of the depositing film, i.e., assuring proper bonding configurations thereof without being significantly incorporated in that film. Though the exact modus operandi of the fluorine atoms and molecules in the plasma chemistry is still subject to conjecture, it will be shown hereinbelow that the presence of relatively small amounts of fluorine in the highly energetic confines of the deposition plasma is extremely effective in conferring significant improvements in the layer of semiconductor alloy material deposited therefrom. The belief that fluorine plays a significant role in organizing plasma chemistry may be ascertained from the fact that improvements in the photoresponsive properties of semiconductor alloy material can be found when only less than one tenth of one percent of fluorine is incorporated into the matrix of that material. It is therefore one aspect of the instant invention to provide deposition plasma with a source of fluorine gas for organizing that plasma into desirable species and producing improved semiconductor alloy material.

The instant invention thus provides a precursor gaseous mixture adapted to provide for the deposition of high quality semiconductor alloys. The mixture includes a silicon-containing gas such as silane and a fluorine-containing gas such as silicon tetrafluoride, fluorosilanes (including fluoropolysilanes), fluorine, flurocarbons; and, in the case where doped alloy materials are being prepared, fluorinated dopant gases such as boron fluorides, phosphorous fluorides, aluminum fluorides and the like. The gas mixture may include a germanium-containing gas if a narrow band gap silicon:germanium alloy is being prepared. It is necessary to mention at this juncture that the narrow band gap silicon:germanium alloys generally exhibit poorer photovoltaic properties than do their silicon alloy counterparts. This is mainly due to the presence of a higher density of defect states in band gaps thereof, particularly deep states. Applicants, in formulating their inventive theories, speculated that fluorine, if properly introduced into the plasma with the properly selected precursor gaseous species of germanium, silicon and diluent gas, could act as a catalyst and promote tetrahedral coordination of the preferred deposition species so as to deposit a narrow band gap (about 1.45 eV) semiconductor alloy material having photovoltaic properties as good as the properties of the about 1.7 eV material. It is a notable feature of the instant invention that only relatively small amounts of the fluorine-containing gas need be employed to secure the aforementioned advantages therefrom.

In accordance with another aspect of the instant invention, it has been found that a precursor gaseous mixture which includes a polysilane compound, such as disilane, and a source of fluorine may be utilized to deposit a layer of semiconductor alloy material having improved photoelectric properties, thereby making such an alloy highly desirable for use in a photovoltaic cell. The polysilane gas and the fluorine-containing gas have thus been found to combine synergystically to still further improve the resultant semiconductor alloy material.

In keeping with the mechanics of the previously discussed model, it is postulated that the plasma decomposition of the polysilane compound produces a favorable number of desirable deposition species and the fluorine present in the plasma acts as a catalyst or organizer to (1) facilitate the creation of still more favorable deposition species, (2) facilitate the deposition of these desirable species in tetrahedral coordination and bonding configurations and (3) act upon the surface of the depositing alloy material to produce a high quality deposit. Additionally, as described hereinabove, the use of polysilanes results in a higher deposition rate, thereby improving the operational efficiencies of the deposition process and eliminating problems of gas depletion when silicon:germanium alloys are being prepared. It should be noted again that fluorine may also be directly incorporated into the polysilane molecule itself. That is to say, the polysilane precursor gas may be of the general formula: $Si_xR_yH_z$, where R is chosen from the group consisting essentially of hydrogen, fluorine, chlorine, iodine, bromine and combinations thereof, x is an interger greater than one, y and z are each an integer or zero, and $y+z=2x+2$. It should be noted that the foregoing formula is meant to include metastable compounds and species as well as stable molecules. Fluorinated polysilanes including metastable species thereof, as well as polysilanes produce a semiconductor alloy material characterized by increased photoconductivity and a decreased density of defect states in the band gaps thereof.

Note that Applicants are not claiming to be the first to utilize disilane gas in a vapor deposition system for the fabrication of semiconductor alloy material. As early as 1981, the use of disilane in a glow discharge deposition process has been reported in numerous papers and patents. For instance, Scott, et al, in a paper entitled "Deposition and Doping of a-Si:H from $Si_2H_6$ Plasmas" published in Tetrahedrally Bonded Amorphous Semiconductors, pp. 6–9 (1981) reported upon the use of disilane for the preparation of silicon alloy films. However, Scott, et al discovered and were reporting on the fact that the use of disilane in such a manner results in a high deposition rate, which deposition rate is significant when depositing relatively thick layers of silicon alloy material. Although Scott, et al had noticed slight differences in the characteristics of the disilane prepared film, vis-a-vis, silane prepared films, they were primarily concerned with securing the high deposition rates which are necessary for depositing a 25 micron thick layer of semiconductor alloy material which is required for a copier drum. It should be noted that nowhere in the Scott, et al paper is there reported (1) the use of disilane in conjunction with a germanium-containing gas to produce a silicon:germanium alloy, (2) the problem of gas depletion which Applicants first discovered and report herein, (3) the use of fluorine as either a catalyst in the plasma or as a density of states reducer in the deposited silicon alloy film and (4) the fabrication of any type of photovoltaic device from the deposited material.

Similar results are reported in U.S. Pat. No. 4,363,828 of Brodsky, et al (Brodsky is one of the authors of the aforedescribed Scott, et al paper). The Brodsky, et al patent discloses the use of disilane in an inductively coupled radio frequency plasma deposition system in which a silicon alloy film is prepared. As in the Scott, et al paper, there is no disclosure of (1) the use of fluorine for any purpose whatsoever, (2) the use of disilane in conjunction with the germanium-containing gas to obviate the problem of gas depletion, (3) the preparation of improved photovoltaic devices by the use of disilane alone or in combination with fluorine and (4) the use of fluorine as either a catalyst in the plasma or as a density of states reducer in the deposited silicon alloy film.

The Canon Corporation reported upon the preparation of photoconductive drums for electrophotographic copiers in U.K. Patent Application Nos. 2,077,451A and 2,087,930A. These publications disclose the preparation of layers of photoconductive semiconductor alloy material from precursor gaseous mixtures of $SiH_4$, $SiF_4$ and a diluent energized in a radio frequency glow discharge process. It is also broadly suggested in these publications that disilane could be similarly employed to fabricate those layers of photoconductive material. However, no examples of a deposition involving disilane, and likewise no operational parameters of the xerographic drum thus prepared, are reported. It should be noted that because the Canon publications are solely oriented toward the preparation of layers of photoconductive amorphous silicon alloy material for use in electrophotographic drums, the material therein disclosed is unsuitable for the fabrication of effective photovoltaic devices insofar as it includes too great a density of defect states in the band gap thereof. It is also noteworthy that the researchers at Canon did not (1) employ fluorine in combination with the disilane as either a catalyst in the plasma or as a density of states reducing element in the deposited semiconductor alloy film (as is evidenced by the fact that they neither were not fabricating material for photovoltaic purposes nor was their material (due to the high density of defect states) capable of use in photovoltaic applications), (2) prepare silicon:germanium alloy materials and (3) report on the use of any polysilane components in the precursor gaseous mixture.

In yet another published U.K. patent application, Ser. No. 2,081,745A, researchers at Canon Corporation reported on another process for the preparation of amorphous silicon alloy materials. Disclosed in the publication is a d.c. or low frequency a.c. (i.e., several Hz) energized plasma deposition process. As disclosed, irradiation with the appropriate wavelength light is utilized to photoconductively discharge built up potential in the silicon alloy material, which potential limits the rate of deposition. Although the example given therein is limited to the use of silane, the disclosure also mentions the possibility of utilizing disilane or germane from which to fabricate amorphous semiconductor alloys. It should be noted that the disclosure is strictly oriented toward the production of a photoconductive copier drum and accordingly does not report on any material or device parameters which are directly applicable to photovoltaic technology. Furthermore, the disclosure (1) provides no examples of the use of disilane, (2) makes no mention of the use of fluorine as either a catalyst in the plasma or as a density of states reducing element in the deposited semiconductor alloy film and (3) does not discuss the fabrication of silicon:germanium alloy materials from non-depleting precursor gaseous mixtures. As with previously described references, disilane is discussed only with a view toward increasing the rate of deposition of the semiconductor alloy material because the photoconductive material of a copier drum must be deposited to a thickness of about 25 microns, as compared to the approximately one-half micron thickness which is deposited in the fabrication of photovoltaic cells.

In a paper entitled "Photoconductive a-SiGe:F:H and Transparent $IrO_x$ for High Efficiency Amorphous Solar Cells", published in the Technical Digest of the International PVSEC-1, Kobe, Japan (1984) pp. 429–432, Oda, et al have reported on the fabrication of a narrow band gap silicon:germanium:fluorine: hydrogen alloy for photovoltaic uses. The alloy is manufactured from a mixture of silicon tetrafluoride, germanium tetrafluoride and hydrogen. As stated by Oda, et al in the body of the paper, various combinations of gases were examined as precursors for the deposition of the alloy, said gases including silane, disilane, silicon tetrafluoride, germane and germanium tetrafluoride. However, Oda, et al reported that the best results were obtained through the use of silicon tetrafluoride, germanium tetrafluoride and hydrogen, where the concentration of hydrogen is typically 30%.

While Oda, et al have admittedly examined disilane containing mixtures for use in the fabrication of narrow band gap silicon:germanium alloys, they failed to recognize the advantages of disilane in terms of (1) the preparation of a significantly improved photovoltaic material, (2) the addition of fluorine to improve tetrahedral coordination in the deposited photovoltaic material and (3) obviating the gas depletion problem first recognized and described by Applicants in the instant application. While Oda, et al noted that the stoichiometry of the deposited semiconductor alloy film is dependent upon that of the precursor gaseous mixture, they did not recognize the problem of gas depletion, presumably because they were fabricating small area samples (under one square centimeter) in a nonproduction mode. For small area depositions, gas depletion problems will not be significant as compared to the gas depletion problems which Applicants encounter in the continuous production of semiconductor alloy material on an elongated web. It should also be abundantly clear, because of the absence of any discussion thereabout, that Oda, et al did not recognize fluorine's unique and synergistic utility as a plasma catalyst for organizing local order of the deposition species present in the highly energetic plasma and for insuring tetrahedral coordination of the depositing species.

In contrast to all the aforedescribed prior art, the instant invention provides a unique class of precursor gaseous mixtures which are particularly adapted for fabricating photovoltaic cells from the glow discharge deposition of successive layers of semiconductor alloy material. When (1) disilane is utilized as the silicon precursor gas, (2) fluorine may be added as a catalyst or organizer in the plasma, as well as a density of states reducer in the depositing film, and (3) hydrogen gas may be used as a diluent in order to provide precursor gas mixtures from which particularly efficient photovoltaic cells may be fabricated. Through the use of such precursor gaseous mixtures, problems of differential process gas depletion, which problems typically occur in the preparation of narrow band gap silicon:germanium alloys, are substantially eliminated. And finally, through the use of such precursor gaseous mixtures, the rate at which high quality semiconductor alloy material may be deposited is substantially increased.

Applicants have stated, explicity as well as impliedly, throughout the course of the preceeding discussion, that the prior art semiconductor alloy material (fabricated through the fluorine-free glow discharge deposition of a disilane-containing precursor mixture pursuant to the processes described by the aforementioned references) is not of the quality necessary to fabricate a high efficiency, high stability photovoltaic device. Because the reasons Applicants claim to have developed superior films may not be readily apparent in light of the confusing number of prior art references and the preceding discussion of that prior art, a more detailed explanation follows.

The explanation is best accomplished with specific reference to the Oda, et al publication, which publication describes an amorphous silicon:germanium:fluorine:hydrogen alloy allegedly having a photoconductivity of $9 \times 10^{-5}$ inverse ohms-centimeters. Applicants state that the narrow band gap semiconductor alloy material described in the instant application, although having a photoconductivity of only approximately $3 \times 10^{-5}$ inverse ohms-centimeters, is a much better photovoltaic material than that of Oda, et al.

Applicants' material is superior to Oda, et al's material in spite of its slightly lower photoconductivity because of the fact that photoconductivity is not, in and of itself, a sufficient measure of the photovoltaic quality of deposited semiconductor alloy material. First of all, photoconductivity data does not give any indication of minority carrier lifetime, an important parameter in characterizing the quality of material adapted for use in a photovoltaic cell. Secondly, photoconductivity is dependent upon the position of the Fermi level (and hence the activation energy) of the particular semiconductor alloy material under consideration. More specifically, as the activation energy decreases, the photoconductivity will increase because charge carriers are moved closer to the conduction band. Therefore, the mere existence of high photoconductivity in a material does not necessarily mean that the material will make a high efficiency photovoltaic device.

As reported in another paper of Oda, et al entitled "Hole Transport in Glow Discharge a-SiFe$_x$H(F) Alloys", the narrow gap material discussed above was characterized as having a high density of states adjacent the conduction band, as is indicated by the high-sub band gap absorption of the semiconductor alloy material prepared by Oda, et al. This high density of defect states reduces the lifetime of minority charge carriers and increases the recombination rate of charge carriers within the band gap. Simply stated, the photoconductivity of Oda, et al's material is relatively high because the Fermi level has been moved closer to the conduction band, thereby reducing the activation energy necessary to promote charge carriers thereto; however, photovoltaic quality is low because of the presence of a high density of defect states.

Therefore, Applicants' narrow band gap semiconductor alloy material, which material has a photoconductivity of approximately $3 \times 10^{-5}$ inverse ohms-centimeters while also having an activation energy of about 0.65–0.75 eV (the Fermi level is pinned proximate midgap) and a low density of defect states, is superior to Oda, et al's semiconductor alloy material even though the photoconductivity of Oda, et al's material is artifically better than Applicants'. The simple fact is that Oda, et al's semiconductor alloy material has an increased density of defect states adjacent the conduction band edge which severely reduces minority carrier lifetime. In contrast thereto, Applicants' low band gap (1.45 eV) semiconductor alloy material is of the same high quality (with respect to the number of defect states in the band gap thereof and the photoconductivity thereof as the best 1.75 eV material heretofore produced (and far superior to any low band gap semiconductor alloy material heretofore produced).

The aforedescribed advantages of the instant invention as well as many other advantages will be made clear by the Detailed Description of the Drawings and the claims which follow.

BRIEF DESCRIPTION OF THE INVENTION

Disclosed herein is a precursor gaseous mixture from which semiconductor alloy material may be fabricated in a vapor deposition process. Said mixture is adapted to substantially improve the fill factor of photovoltaic devices which include therein the semiconductor alloy material. To that end, the mixture includes a silicon-containing gas, a fluorine-containing gas and a diluent gas. The mixture is capable of being utilized to deposit a 5000 angstrom thick layer of intrinsic silicon semiconductor alloy material, which, when fabricated into a single photovoltaic cell, provides a cell characterized by a fill factor of at least 0.7. Alloys of this type may be employed to fabricate stable photovoltaic cells characterized by (1) an initial efficiency of greater than 8.5% and (2) less than 10% degradation after 20 hours of exposure to AM-1 illumination.

In a first preferred embodiment, the silicon-containing gas includes a polyatomic silicon species therein, such as a species of the general formula $Si_xR_yH_z$ where R is chosen from the group consisting essentially of hydrogen, fluorine, chlorine, iodine, bromine and combinations thereof and x is an integer greater than 1, y and z are each an integer or zero and $y+2=2x+2$. Disilane is one particularly preferred silicon-containing gas.

The fluorine-containing gas may be chosen from the group consisting essentially of fluorine, fluorinated silicon compounds, fluorinated boron compounds, fluorinated phosphorus compounds, fluorocarbons and combinations thereof. Silicon tetrafluoride is one particularly preferred fluorine-containing gas and fluorinated polysilanes are another. The diluent gas may be chosen from the group consisting essentially of helium, argon, xenon, neon and combinations thereof.

The same mixture may be employed to fabricate a doped layer of semiconductor alloy material by the inclusion of a dopant gas therein. In some preferred embodiments, the dopant-containing gas may also be the fluorine-containing gas.

In yet another preferred embodiment of the instant invention, the precursor gaseous mixture includes disilane, silicon tetrafluoride and hydrogen. Photovoltaic devices fabricated from semiconductor alloy layers deposited from said gas mixture are characterized by high efficiencies, i.e., at least equal to the efficiencies of devices incorporating non-fluorinated layers. The devices are also characterized by high stabilities, i.e., less than 10% photodegradation after 20 hours of exposure to AM-1 illumination. The aforementioned efficiency and stability are possible despite the fact that the semiconductor alloy material may be deposited at a rate of at least 3-4 angstroms per second.

In one particularly preferred embodiment, the precursor gaseous mixture comprises by volume, approximately 0.5 to 3 parts of disilane, approximately 0.05 to 0.5 parts of silicon tetrafluoride and approximately 3.0 to 15.0 parts of hydrogen gas.

There is also disclosed herein a precursor gaseous mixture specifically adapted for the vapor deposition of a narrow band gap semiconductor alloy material. The mixture includes a silicon-containing gas, a germanium-containing gas, a fluorine-containing gas and a diluent gas. The mixture is adapted to deposit a layer of semiconductor alloy material characterized by a band gap of less than 1.5 eV. A single cell photovoltaic device incorporating that alloy layer exhibits an efficiency of greater than 6.5%.

In yet another preferred embodiment, the precursor gaseous mixture may include a polyatomic silicon species therein. The polyatomic silicon species is of the formula, $Si_xR_yH_z$ where R is chosen from the group consisting essentially of hydrogen, fluorine, chlorine, iodine, bromine and combinations thereof, x is an integer greater than 1, y and z are each an integer or zero and $y+z=2x+2$. Disilane is one preferred silicon-containing gas. The fluorine-containing gas may be chosen from the group consisting essentially of fluorine, fluorinated silicon compounds, fluorinated boron compounds, fluorinated phosphorus compounds, fluorocarbons and combinations thereof. Silicon tetrafluoride is one especially preferred fluorine-containing gas and fluorinated polysilanes are another. The diluent gas may be chosen from the group consisting essentially of hydrogen, helium, argon, xenon, neon and combinations thereof.

One particularly preferred mixture from which to fabricate narrow band gap material comprises by volume, approximately 0.5 to 3.0 parts of the silicon-containing gas, 0.5 to 3.0 parts of the germanium-containing gas, and approximately 3.0 to 15.0 parts of the diluent gas. Said mixture is adapted for the deposition of a semiconductor alloy material having a band gap of approximately 1.3 to 1.55 eV. Dopant gases may also be included to change the conductivity type of the layer of deposited semiconductor alloy material.

Another particularly favored deposition mixture for the deposition of narrow band gap semiconductor alloy materials includes disilane, silicon tetrafluoride, germane and hydrogen. Under glow discharge plasma conditions, the silicon and germanium decompose at approximately equal rates and the mixture deposits a semiconductor alloy material at rates of at least 3-4 angstroms per second. The photoconductivity of the thus produced narrow band gap semiconductor alloy material is at least $3\times 10^{-5}$ inverse ohms-centimeters.

A still further improved precursor gaseous mixture from which to vapor deposit high quality semiconductor alloy material includes a semiconductor-containing gas and a plasma organizer-containing gas. The organizer gas is adapted to catalyze the development of tetrahedral coordination in the depositing species even though less than 1% of the organizer gas is incorporated into the deposited semiconductor alloy material.

Also included in the instant invention are methods for the fabrication of layers of semiconductor alloy material utilizing the aforementioned precursor gas mixtures.

BRIEF DESCRIPTION OF THE DRAWINGS

FIG. 2 is a chart contrasting the photovoltaic properties of interest of the following narrow band gap precursor gaseous mixtures (1) $SiH_4$, $GeH_4$, $H_2$; (2) $Si_2H_6$, $GeH_4$, $H_2$; (3) $SiH_4$, $GeH_4$, $SiF_4$, $H_2$; and (4) $Si_2H_6$, $GeH_4$, $SiF_4$, $H_2$.

DETAILED DESCRIPTION OF THE DRAWINGS

I. The Photovoltaic Cell

Figure 1:
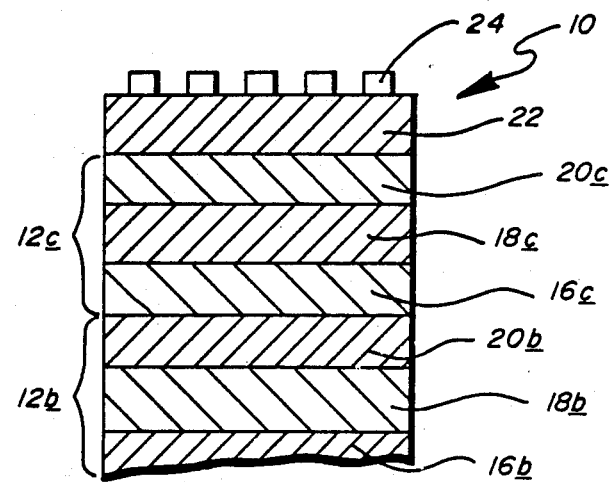
FIG. 1 is a fragmentary, cross-sectional view of a tandem photovoltaic device structured in accordance with the principles of the instant invention and comprising a plurality of n-i-p type photovoltaic cells.
Figure 1:
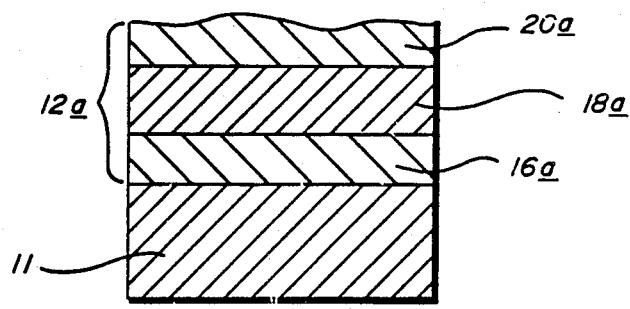

Referring now to the drawings and particularly to FIG. 1, a photovoltaic cell, formed of a plurality of successive n-i-p layers, each of which includes, preferably, an amorphous thin film semiconductor alloy material is shown generally by the reference numeral 10.

More particularly, FIG. 1 shows an n-i-p type photovoltaic device such as a solar cell made up of individual n-i-p type cells 12a, 12b and 12c. Below the lowermost cell 12a is a substrate 11 which may be formed of a transparent glass or synthetic polymeric member; or formed from a metallic material such as stainless steel, aluminum, tantalum, molybdenum, chrome; or formed from metallic particles embedded within an insulator. Although certain applications may require a thin oxide layer and/or a series of base contacts prior to the deposition of semiconductor alloy material, the term "substrate" shall include not only a flexible film, but also any elements added thereto by preliminary processing. Also included within the scope of the present invention are substrates formed of synthetic polymers and, metals coated with a synthetic polymer to which conductive electrodes are applied.

Each of the cells 12a, 12b and 12c are preferably fabricated with a thin film semiconductor body containing at least a silicon or silicon: germanium alloy. Each of the semiconductor bodies incudes a p-type conductivity semiconductor layer 20a, 20b and 20c; a substantially intrinsic semiconductor layer 18a, 18b and 18c; and an n-type conductivity semiconductor layer 16a, 16b and 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Similarly, the tandem cell may include only two stacked cells. Also, although n-i-p photovoltaic cells are illustrated, the methods and materials of this invention may also be and are preferably utilized to produce single or multiple p-i-n cells. Accordingly, the term "n-i-p type" as used herein is meant to include any aggregation of n, i and p layers operatively disposed to provide a photoactive region for generating charge carriers in response to the absorption of photon energy. Additionally, semiconductor layers produced by instant invention may be readily employed to produce p-n cells, Schottky barrier cells, as well as other semiconductor devices such as diodes, memory arrays, photoconductive devices and the like.

It is to be understood that following the deposition of the semiconductor alloy layers, a further deposition process may be either performed in a separate environment or as a part of a continuous process. In this step, a TCO (transparent conductive oxide) layer 22, preferably formed of indium tin oxide, is added atop the p-layer 16c of the top most cell 12c. An electrode grid 24 may be added to the device where the cell is of a sufficiently large area, or if the conductivity of the TCO layer 22 is insufficient to assume efficient collection of photogenerated current. The grid 24 is adapted to shorten the carrier path and increase the conductive efficiency.

II. The Precursor Gas Mixtures

In accordance with the principles of the instant invention, and as discussed briefly hereinabove, there is encompassed herein a variety of precursor gaseous mixtures adapted for use in a glow discharge deposition process for the preparation of semiconductor alloy material. In a first embodiment, the components of the mixture are adapted to deposit high quality silicon based (approximately 1.7 eV band gap) semiconductor alloys. To that end, the process gas components include a silicon-containing gas, a fluorine-containing gas and a diluent-containing gas. The gaseous mixture, when subjected to glow discharge deposition conditions, the parameters of which are detailed hereinbelow, readily deposits a high quality layer of silicon: fluorine: hydrogen material. As will be shown by the examples which follow, a 5000 angstrom thick layer of said intrinsic silicon alloy material fabricated from this gaseous mixture may be employed to fabricate a photovoltaic device having a fill factor of at least 0.7, an initial efficiency of at least 8.5%, and a resistance to photodegradation which quantitatively measures less than 10% after 20 hours of exposure to AM-1 illumination.

The precursor gaseous mixture includes approximately 0.5 to 3.0 parts by volume of the silicon-containing gas which may be silane or a polyatomic silicon-containing species such as disilane or other higher order silanes. The fluorine-containing gas is present in approximately 0.01 to 3.0 parts by volume. As discussed previously, fluorine is believed to act, even in relatively small amounts, as a plasma organizer or calalyst and is thus deemed responsible for the high quality photoelectronic properties of the semiconductor alloy material deposited therefrom. A wide variety of fluorine-containing gas sources may be used. Silicon tetrafluoride gas is one fluorine-containing gas which has demonstrated particular utility, however elemental or molecular fluorine may also be advantageously employed as may be other fluorinated silicon compounds, fluorinated boron compounds, fluorinated phosphorous compounds, fluorocarbons as well as combinations thereof. In addition to being provided as a discrete source, the fluorine-containing gas may also form at least a portion of the silicon-containing gas, i.e. fluorinated silane and polysilane compounds may also be utilized. Therefore, a general formula for such silicon-containing gases which can be used pursuant to principles espoused herewith, is represented by: $Si_xR_yH_z$ where x is an integer, R is chosen from the group consisting essentially of hydrogen, halogens, and various mixtures thereof, y and z are each an integer or zero, and $y+z=2x+2$.

This class of precursor gaseous mixtures also includes a diluent gas such as hydrogen, which gas (1) serves to control the rate of deposition of the depositing species, (2) serves to adjust the concentration of the depositing species to assure the optimum morphology of the deposit and (3) may also serve to facilitate the decomposition of the silicon-containing and/or fluorine-containing gases. While hydrogen is one prefered diluent gas, other gases such as nitrogen or inert gases such as helium, argon, neon and xenon may be similarly employed. These precursor gaseous mixtures may comprise, for example, by volume approximately 0.5 to 3.0 parts of the silicon-containing gas, 0.01 to 3.0 parts of the fluorine-containing gas and approximately 3.0 to 30.0 parts of the diluent gas.

Dopant gases may also be included in the deposition mixture to provide for the glow discharge deposition of doped layers of semiconductor alloy material. Typical dopant gases such as, for example phosphine, diborane, phosphorous trifluoride, phosphorous pentafluoride, and boron trifluoride may also be employed. It should be noted that the latter three dopant gases, since they include fluorine, may also function as the source of fluorine for the precursor gaseous mixture.

Further, the previously described precursor gaseous mixtures may include a germanium-containing gas therein in addition to the silicon-containing gas, fluorine-containing gas and diluent gas. Such a mixture may be employed to deposit a narrow band gap layer of semiconductor alloy material having at least 20% germanium incorporated into the host matrix thereof. Said narrow band gap semiconductor alloy material, when utilized as the intrinsic layer of a single cell photovoltaic device, provides a photoconversion efficiency of greater than 6.5%. The silicon-containing, fluorine-containing and diluent gases may be as previously described, while the germanium-containing gas may be chosen from readily available germanium-containing gaseous compounds. While germane gas is preferred, germanium tetrafluoride and other fluorinated germanium-containing compounds may also be employed with advantage and may, in some cases, also serve as the source of fluorine in the precursor mixture. The germanium-containing gas is preferably introduced so as to be present in the mixture in the same range as the silicon-containing gas, that is to say from 0.5 to 3.0 parts by volume.

Another class of precursor gaseous mixtures of the instant invention includes a polyatomic silicon-containing gas such as disilane or other higher order silanes as well as variously substituted analogues thereof, in conjunction with a germanium-containing gas such as germane. The two semiconductor-containing gases must be chosen to decompose and deposit their respective semiconductor species at approximately equal rates when subjected to the electromagnetic field of a glow discharge deposition system. In this manner, the components of the mixture serve to substantially eliminate heretofore encountered gas depletion problems. In one preferred precursor gaseous mixture, the silicon-containing component is disilane and the germanium-containing component is germane. Other silicon-containing gases such as trisilane or other higher order silanes may also be advantageously employed. The precursor gaseous mixture also typically includes a diluent gas such as hydrogen or an inert gas, as previously enumerated, to control the rate of deposition, to adjust the concentration of the semiconductor-containing gases for assuring optimum morphology and, in some cases, to assist in the decomposition of the precursor gaseous mixture.

While the nondepleting precursor gaseous mixture for depositing the narrow band gap semiconductor alloy material may be utilized as described, it has been found that the inclusion of even small amounts of a fluorine-containing gas therein will organize plasma conditions and assure the deposition of desired species from the plasma. Fluorine may be provided from any of the previously discussed gaseous sources. Generally speaking, the precursor gaseous mixtures will include 0.3 to 3.0 parts by volume of the polyatomic silicon-containing gas, 0.3 to 3.0 parts by volume of the germanium-containing gas and 3 to 30 parts by volume of the diluent gas. If fluroine is included, the fluorine-containing gas is present in 0.01 to 3.0 parts by volume. As previously discussed, the mixture may also include a dopant gas therein, which dopant may also serve as the source of fluorine.

III. Glow Discharge Deposition Process

There are a number of glow discharge deposition processes well known to those skilled in the art and fully described in detail in the patents and applications previously referred to and incorporated herein by reference. However, it will be of some help in understanding the context, scope and applicability of the precursor gaseous mixtures of the instant invention to briefly recapitulate the basic mechanisms of glow discharge deposition systems.

The glow discharge deposition of semiconductor alloy material is carried out within the vacuum envelope of a deposition chamber in order to isolate the deposition atmosphere from ambient conditions and provide the type of low pressure regime needed for igniting and sustaining the plasma and limiting unwanted molecular and atomic collisions. The deposition chamber is typically formed of a nonpermeable material such as glass or metal and has one or more vacuum pumps connected thereto for the evacuation of the atmosphere therefrom. The deposition chamber also includes one or more gas introduction manifolds for introducing any combination of the discrete process gases, which combine to form the precursor gaseous mixture, into the chamber. Further included in the chamber is a support for maintaining the a substrate a fixed distance from the cathode for the uniform deposition of semiconductor alloy material thereonto. At the heart of the deposition process is a source of electromagnetic energy for energizing the precursor gaseous mixture to effect the decomposition and deposition thereof. The source of electromagnetic energy may include a cathode or an antenna depending on the type of electromagnetic energy employed. The precursor gaseous mixtures of the instant invention may be employed, with equal effectiveness, in microwave or radio frequency energized systems. Radio frequency excitation of the precursor gaseous mixture is typically accomplished by introducing the mixture into the plasma region formed between the generally planar cathode plate and the substrate which, as stated above, is disposed in relatively close proximity thereto. On the other hand, microwaves are generally introduced either from an antenna designed to radiate microwave energy into the deposition chamber, or in other embodiments, from a source such as a magnetron coupled to a waveguide cavity. In those instances in which a waveguide cavity is employed, the substrate preferably forms at least a portion of the waveguide cavity and the precursor gaseous mixture is introduced adjacent thereto so that the deposition occurs directly onto the substrate.

The glow discharge deposition of semiconductor alloy material may be carried out in either a batch or continuous mode of production. In a batch deposition process, a single chamber is generally employed for the deposition of the material onto a discrete substrate which is loaded thereinto. Continuous processing is most advantageously employed for the high volume deposition of the semiconductor alloy material, and hence the mass production of photovoltaic devices therefrom. In the continuous mode of production, a plurality of interconnected and vacuumized deposition chambers are provided. Each chamber is interconnected to adjacent chambers by discrete isolation chambers which allow for the continuous passage of an elongated web of substrate material therebetween while preventing the gaseous environments of the adjacent chambers from contaminating one another. In this manner, a single elongated web of substrate material may be continuously advanced through the plurality of deposition chambers for the depositon of successive layers of doped or intrinsic semiconductor alloy material thereonto. It is to be noted that the precursor gaseous mixtures of the instant invention may be advantageously employed in either the batch or in the continuous modes of production; however, it is in the high volume, continuous deposition of semiconductor alloy material onto a web of substrate material that the aforementioned problems of gas depletion are the most significant.

Regardless of the particular configuration of the deposition chamber or chambers employed, or regardless of the particular type of electromagnetic energy utilized to effect the deposition, it is the decomposition of the precursor gaseous mixture which results in the formation of the semiconductor deposit. The electromagnetic energy acts upon the precursor gaseous mixture to generate a host of activated species therefrom by a process that may include ionizing, radicalizing, or otherwise activating the molecules of the mixture gas to form the highly energetic species. While it is desirable to limit the number of molecular collisions within the uncontrolled environment of the plasma, these activated deposition species interact (collide) with one another until they are finally deposited onto the substrate. The number of collisions, the composition of the colliding molecules, the form and number of ions and free radicals may be controlled to some extent by varying systems parameters such as the pressure within the chamber, the temperature of the substrate, the external bias placed upon the substrate, as well as, of course, the relative ratio and nature of the components of the precursor gaseous mixture.

In order to practice the glow discharge deposition of semiconductor alloy material, a substrate is first moved into the deposition chamber, the substrate is heated to the deposition temperature, typically 150°–300°, the chamber is evacuated to the working pressure range, typically a range of about 0.5 to 10 torr and the components of the precursor gaseous mixture are introduced thereinto so as to create a gaseous atmosphere at least in the region proximate the substrate. Electromagnetic energy is then provided, either by a electrode or an antenna as described previously, to effect the decomposition of the precursor gaseous mixture and the deposition of the semiconductor alloy material.

IV. Examples

The following examples are intended to summarize the results of the various experiments and measurements which illustrate the principles and advantages attainable through the use of the precursor gaseous mixtures of the instant invention.

EXPERIMENT 1

In this experiment the role of fluorine as a plasma cataytst and organizer was assessed. A series of five 1.5 eV band gap layers of silicon:germanium alloy material were deposited by the glow discharge deposition of the precursor gaseous mixtures summarized in TABLE 1. below:

TABLE I

| Sample | Flow Rates (SCCM) | | | | ph (ohm-cm)$^{-1}$ |
| --- | --- | --- | --- | --- | --- |
| | $Si_2H_6$ | $SiF_4$ | $GeH_4$ | $H_2$ | |
| I. | 5 | 0 | 5 | 50 | $1 \times 10^{-5}$ |
| II. | 5 | 5 | 5 | 50 | $3 - 4 \times 10^{-5}$ |
| III. | 5 | 2.5 | 5 | 50 | $3 - 4 \times 10^{-5}$ |
| IV. | 5 | 1.25 | 5 | 50 | $3 - 4 \times 10^{-5}$ |
| V. | 5 | .6 | 5 | 50 | $2 \times 10^{-5}$ |

It should be noted herein, with reference to the data of Table 1 and to all other data presented herein, that given flow rates are all nominal values. Exact measurement will depend upon the precise geometry of the deposition system and would require the use of a calibrated flow meter. While the relative valves given indicate ratios useful in the practice of the instant invention, other values may also have similar utility.

The samples were prepared by the radio frequency energized glow discharge deposition of five precursor gaseous mixtures differing from one another only in the amount of the silicon tetrafluoride gas component included therein. The quality of the thus deposited alloys was assessed by measuring the photoconductivity thereof in the coplanar direction by techniques well known to those skilled in the art. As discussed in the background portion of this application, photoconductivity itself cannot be regarded as a full and total measure of the photovoltaic quality of a particular layer of semiconductor alloy material insofar as the photoconductivity depends, inter alia, upon the activation energy of that alloy material. However, in the case of the instant experimental series, no significant differences in activation energy between any of the samples was seen. Accordingly, the measured photoconductivity of the material provided a good indication of the actual photovoltaic quality of the particular samples.

It will be noted from Table I that the first sample included no silicon tetrafluoride in the precursor gaseous mixture thereof and resulted in the deposition of semiconductor alloy material having the lowest photoconductivity, i.e., $(1) \times 10^{-5}$ inverse ohms-centimeters. In the second sample, 5 sccm of silicon tetrafluoride was introduced into the deposition chamber, which flow rate resulted in the deposition of a semiconductor alloy material having a photoconductivity three to four times higher than that of the non-fluorinated sample. As previously explained, disilane and germane decompose and deposit semiconductor alloy material at a rate greater than the rate of deposition of semiconductor alloy material deposited from silicon tetrafluoride. Accordingly, the presence of a second silicon-containing gas (the silicon tetrafluoride) did not significantly change the silicon content in the deposited film. An analysis of the film deposited as Sample II indicated a fluorine content of only .07% (plus or minus .02%).

In the preparation of samples III-V, the amount of silicon tetrafluoride was successively decreased by approximately 50%. It is notable that no loss in the enhanced photoconductivity attributed to the presence of fluorine in at least the gas phase occured until there was almost a ten fold reduction in the amount of silicon tetrafluoride introduced into the precursor gaseous mixture. An inspection of the results for Sample V reveal that even though the flow rate for silicon tetrafluoride was reduced to approximately 0.6 sccm, the photoconductivity was still twice as great as the photoconductivity of non-fluorinated Sample I. No measurement of the amount of florine present in Sample V was made insofar as any such amount would be so small as to be beyond detection limits.

The conclusion to be drawn from this experimental series is that fluorine exerts a very significant effect in the deposition of high quality photovoltaic alloy films and this effect is manifested even when fluorine is introduced into the precursor gaseous mixture, for plasma deposition, in exceedingly small amounts. It can therefore be hypothesized that fluorine acts catalytically to organize the tetrahedral coordination of depositing species, and/or to remove weakly bond atoms and molecules from the depositing layer of semiconductor alloy material and/or to passivate dangling or vacant bonds for assuring the deposition of only high quality semiconductor alloy materials.

EXPERIMENT 2

In this experiment a single n-i-p type photovoltaic cell was formed, which cell included a 1500 angstrom thick intrinsic layer, said layer deposited from a precursor gaseous mixture of 2% $Si_2H_6$, 96% $H_2$ and 2% $SiF_4$. The intrinsic layer was sandwiched between n and p doped silicon alloy layers of approximately 150 angstroms thickness. All layers were deposited by the 13.56 MHz radio frequency energized glow discharge decomposition technique previously described. The efficiency of the thus produced photovoltaic device was approximately 6.2% as measured under AM-1 illumination. The open circuit voltage of that device was 9.24 volts and the fill factor was 0.730.

A similarly prepared photovoltaic cell having an approximately 2000 angstrom thick intrinsic layer and exhibiting an initial efficiency of approximately 8.4% was exposed to AM-1 illumination to assess the photodegradation thereof. It was found that after 75 hours of illumination, a loss of only 5% of the initial operating efficiency occurred. This level of photodegradation is to be compared with a typical loss in photoconversion efficiency exceeding 25% for similarly configured photovoltaic cells fabricated from silane and hydrogen but specifically excluding fluorine.

EXPERIMENT 3

In this experiment, the synergistic effect of fluorine and disilane in the deposition of a silicon:germanium alloy material was demonstrated. A precursor gaseous mixture comprising 5 SCCM of disilane, 5 SCCM of silicon tetrafluoride, 4 SCCM of germane and 70 SCCM of hydrogen was exposed to 13.56 MHz of radio frequency energy under glow discharge deposition conditions to deposit a layer of semiconductor alloy material.

A similar mixture, only devoid of fluorine, was likewise utilized for the deposition of a second layer of semiconductor alloy material. A third mixture of 10 SCCM of silane, 5 SCCM of silicon tetrafluoride, 1.5 SCCM of germane and 70 SCCM of hydrogen was utilized to deposit a third layer of semiconductor alloy material. It was found that the two disilane containing precursor gaseous mixtures both deposited layers of semiconductor alloy material at approximately 3-5 angstroms per second, whereas the silane-containing mixture deposited an alloy at a rate of only 1-2 angstroms per second. No gas depletion problems were presented by either of the disilane mixtures, however, the gases in the silane-containing mixture deposited at differing rates, thereby requiring that the initial composition of the mixture be adjusted accordingly.

Photoconductivity of the sample deposited from the disilane-fluorine mixture was $3 \times 10^{-5}$ inverse ohms-centimeters whereas the photoconductivity of the disilane and the fluorinated silane prepared samples was only $1 \times 10^{-5}$, inverse ohms-centimeter. Furthermore, the sub-band gap absorption of the latter two samples was approximately 3-4 times higher than for the sample prepared from the disilane-fluorine mixture. An analysis of the deposited film showed that approximately 10-15% hydrogen was present in all three samples whereas fluorine was present in the disilane-fluorine prepared sample and the silane-fluorine prepared sample at no more than 0.1%. Additionally, it was found that the sample prepared from the disilane-fluorine mixture included approximately 40% germanium, the largest reported amount of germanium that has been included in a silicon alloy film without detrimentally affecting the electronic properties thereof.

Experiment 4

Referring now to FIG. 2, there is illustrated a table summarizing data derived from an experimental series assessing the effect of the precursor gaseous mixtures of the instant invention on the preparation of silicon:germanium alloys. It will be noted from an inspection of that Figure that four separate categories of precursor gaseous mixtures were used to deposit different films of semiconductor alloy material. The first column of the table in FIG. 2 represents semiconductor alloys prepared from a precursor gaseous mixture comprising silane, germane, hydrogen and in some cases, trace amounts of diborane. The second column represents semiconductor alloys prepared from a precursor gaseous mixture comprising disilane, germane and hydrogen. The third column represents alloys prepared from a precursor gaseous mixture comprising silane, germane, silicon tetrafluoride and hydrogen with the inclusion of, in some cases, trace amounts of diborane. The fourth column represents alloys prepared from a precursor gaseous mixture of disilane, germane, silicon tetrafluoride and hydrogen.

For each precursor gaseous mixture, various physical parameters are recorded, namely: photoconductivity, dark conductivity, band gap, activation energy, sub-band gap absorption (which is a measure of the density of tail states in the band gap) and deposition rate of the alloys. Also reported is the photodegradation manifested by single n-i-p type photovoltaic cells into which the layers of semiconductor alloy material prepared from the aforementioned precursor gaseous mixtures are incorporated. It should be noted that trace amounts of boron were included in the two silane produced samples in order to be able to manufacture photovoltaic devices therefrom which exhibited a given level of photoconductivity. In the absence of boron doping, the semiconductor alloy deposited from the mixture was of too low a photoconductivity and too high a defect density to enable the manufacture of photovoltaic device having readily measurable electronic properties, such as photoconductivity therefrom.

The first group of samples was prepared from a precursor gaseous mixture comprising 10 sccm of hydrogen, 1 sccm of germane, 8 sccm of silane and 3 sccm of a mixture of 500 ppm of diborane in hydrogen (where used). The second group of samples were prepared from a precursor gaseous mixture comprising 32 sccm of hydrogen, 2 sccm of germane, and 2.5 sccm of disilane. The third group of samples were prepared from a precursor gaseous mixture comprising 4 sccm of hydrogen, 7 sccm of silicon tetrafluoride, 1 sccm of germane, 7 sccm of silane and 3 sccm of a mixture of 500 ppm of diborane in hydrogen (where used). The fourth group of samples were prepared from a precursor gaseous mixture comprising 52 sccm of hydrogen, 2.5 sccm of silicon tetrafluoride, 2.0 sccm of germane, and 2.5 sccm of disilane. It should be noted, as previously discussed, all rates are nominal.

All of the foregoing samples were deposited by glow discharge deposition as energized by radio frequency energy of 13.56 mHz in accordance with techniques well known to those skilled in the art.

It will be noted from an inspection of the Chart of FIG. 2 that the photoconductivity of the silicon:germanium:fluorine:hydrogen alloy deposited from the mixture including disilane and fluorine is approximately $2-3 \times 10^{-5}$ inverse ohms-centimeters, which photoconductivity is at least one order of magnitude higher than the photoconductivity of $3-6 \times 10^{-6}$ inverse ohms-centimeters manifested by the other three samples. It will also be noted that the inclusion of small amounts of boron into the deposited semiconductor alloy material effects an increase in the photoconductivity, although as will be explained below, this increase is not reflected in improved electronic properties.

The dark conductivity of all four of the layers of semiconductor alloy material is fairly high, i.e., in the range of $10^{-8}$-$10^{-9}$ inverse ohms-centimeters, a figure in the "noise" level of measurement for purposes of this comparison. The band gaps of the four groups of semiconductor alloy samples are all approximately 1.5 eV, indicating that relatively similar amounts of germanium were incorporated into the host matrix of each. The activation energy of the four groups of samples are relatively similar, although it will be noted that the two groups of samples deposited from the disilane-containing gas have a slightly lower activation energy than do the silane deposited samples. This shift in Fermi level position is very slight and is comparable to the shift produced by trace amounts of the boron dopant. In any case, the shift in the Fermi level is of a sufficiently small magnitude that all of the samples may be regarded as being of substantially intrinsic conductivity type.

The relative sub-band gap absorption of the various groups of samples is graphically indicative of the low density of tail states exhibited by those samples. Tail states are those defect states (such as dangling bonds, strained bonds, vacant bonds, etc.) which occur at the edge of the band gap. A high density of tail states will impede charge carriers travelling across the band gap by providing traps and other recombination centers.

Obviously, in any semiconductor alloy material it is desirable to have the total density of states as low as possible in order to promote a maximum number of charge carriers to the conduction band and to secure optimum electrical properties therefrom.

The sub-band gap absorptions of the samples were measured by photodeflection spectroscopy at an energy of 1.1 eV and thus are indicative of states proximate the edge of the valence band. It will be noted that the relative density of tail states of the samples prepared from the fluorinated and nonfluorinated silane mixtures, as well as the nonfluorinated disilane prepared samples, is 5 to 10 times higher than that of the samples prepared from disilane and fluorine. It will further be noted that the addition of trace amounts of boron has no effect whatsoever upon the density of tail states. It should be clear from this data that there is a synergistic effect occurring with the combination of a fluorine-containing gas and disilane, which effect reduces the density of tail states in a manner which neither disilane or fluorine can accomplish individually.

The data on deposition rates, summarized in the chart, is clearly indicative of the fact that disilane based precursor gas mixtures decompose and deposit high quality semiconductor alloy films at rates greater than do silane precursor gaseous mixtures.

Representative samples of the various layers of semiconductor alloy material represented herein were fabricated into single n-i-p-type photovoltaic cells. This was accomplished by well known techniques in which a layer of n-type silicon alloy material was first deposited upon an electrically conductive stainless steel substrate. The n-type alloy in each case was a microcrystalline n-type layer of approximately 150 angstrom thickness. Atop this n-type layer, an approximately 2000 angstrom thick layer of substantially intrinsic semiconductor alloy material was deposited, followed by the deposition thereupon of a layer of microcrystalline p-type silicon alloy material of approximately 150 angstrom thickness. The photovoltaic device was completed by depositing a transparent, electrically conductive top electrode of approximately 450 angstroms of indium tin oxide atop the p-type layer. In this manner, the two doped layers cooperate to provide an electric field across the intrinsic layer for generating a photoactive region therein, in which region the absorption of photons from incident radiation generates charge carriers which are subsequently collected at the substrate electrode and the indium tin oxide electrode.

Photodegradation, also termed Staebler-Wronski degradation, is one of the biggest problems which has heretofore plagued prior art amorphous photovoltaic devices. This degradation, although poorly understood, is a light induced process which derogatorily affects the efficiency of photovoltaic devices. It has been found that photodegradation proceeds in an exponential manner with initial degradation being very rapid and quickly reaching a saturation limit.

It should be reiterated at this point that the silane based silicon:germanium alloy samples not containing boron, had a high density of defect states as initially prepared and, accordingly, photodegradation could not be readily measured in the photovoltaic devices in which they were incorporated. The inclusion of small amounts of boron in those alloy samples was necessary in order to produce a photovoltaic device having sufficient operational efficiency to allow for measurement of photodegradation. The disilane, germane hydrogen material, as prepared, was also a fairly high defect material which could not be readily fabricated into a useable photovoltaic cell; accordingly no data can be presented for photodegradation of these samples.

It will be seen from the chart of FIG. 2 that the non-fluorinated silicon:germanium alloy cell exhibited the highest photodegradation, i.e.,. a loss in efficiency of 34% after only 16 hours of AM-1 illumination. Incorporation of fluorine into the precursor gaseous mixture thereof effected a significant reduction in the photodegradation, resulting in a cell which degraded only 12% after that 16 hours of exposure. The best results, were obtained from the use of a precursor gaseous mixture of disilane and fluorine. Photovoltaic cells produced from an alloy deposited from that mixture exhibited only a 5% degradation after 16 hours of exposure.

It may thus be seen from the data summarized in the chart of FIG. 2 that (1) disilane increases the deposition rate of silicon-containing germanium alloys; (2) the addition of fluorine to silicon:germanium alloys improves the stability and efficiency of those alloys; and (3) the combination of disilane and fluorine provides a high deposition rate and interacts synergistically to form a semiconductor alloy exhibiting greatly increased resistance to photodegradation, a lower density of defect states in the band gap thereof and increased photovoltaic efficiency.

It should be noted that numerous modifications and changes may be made to the precursor gaseous mixtures disclosed herein in keeping with the spirit of the instant invention. The the essence of the instant invention resides in the recognition of the fact that (1) problems of gas depletion occuring in the deposition of multi-component semiconductor alloys may be obviated by employing precursor gaseous mixtures including therein semiconductor-containing gases that decompose and deposit at approximately similar rates; (2) higher order polysilanes, such as disilane, produce semiconductor alloy material having electronic properties which make them desirable for use in photovoltaic applications; (3) fluorine, even in relatively small amounts, acts as a plasma catylst or organizer which assures proper spatial and/or electronic configurations in glow discharge deposited semiconductor alloy materials and (4) higher order polysilanes such as disilane and fluorine-containing precursor gases interact synergistically in a glow discharge deposition plasma to produce significantly improved photovoltaic alloys having high quality electronic properties, from which stable, high efficiency photovoltaic devices may be fabricated.

Numerous other components may be added to the precursor gaseous mixture to deposit doped semiconductor alloys or to further facilitate deposition of the alloys within the spirit of the instant invention. The preceeding discussion and examples are merely meant to be illustrative of some of the features of the instant invention. It is the following claims, including all equivalents, which are intended to define the scope of the instant invention.

What is claimed is:

1. A gaseous precursor mixture from which semiconductor alloy material may be deposited by glow discharge decomposition:
   said mixture including a polysilane compound and a germanium-containing compound, said compounds capable of decomposing and depositing at substantially similar rates when subjected to electromagnetic energy; and said polysilane compound having the general formula $Si_xR_yH_z$, where R is chosen from the group consisting essentially of hydrogen, fluorine, chlorine, iodine, bromine and combinations thereof, x is an integer greater than one, y and z are each an integer or zero, and $y+z=2x+2$.

2. A mixture as in claim 1, further including a diluent gas.

3. A mixture as in claim 2, wherein the diluent gas is hydrogen.

4. A mixture as in claim 1, further including a gaseous precursor source of fluorine.

5. A mixture as in claim 4, wherein said source of fluorine is silicon tetrafluoride.

6. A mixture as in claim 1, wherein said mixture further includes a source of hydrogen.

7. A mixture as in claim 1, wherein said mixture further includes a gaseous precursor source of a dopant element.

8. A mixture as in claim 7, wherein said dopant element is phosphorous.

9. A mixture as in claim 7, wherein said dopant element is boron.

* * * * *